(12) United States Patent
Morgan

(10) Patent No.: US 8,387,660 B2
(45) Date of Patent: Mar. 5, 2013

(54) SPLIT FLOW VALVE ARRANGEMENT

(75) Inventor: Antony Morgan, Wolverhampton (GB)

(73) Assignee: Rolls-Royce PLC, London (GB)

( * ) Notice: Subject to any disclaimer, the term of this patent is extended or adjusted under 35 U.S.C. 154(b) by 159 days.

(21) Appl. No.: 13/156,817

(22) Filed: Jun. 9, 2011

(65) Prior Publication Data
US 2012/0006433 A1 Jan. 12, 2012

(30) Foreign Application Priority Data

Jul. 9, 2010 (GB) .................................. 1011554.1

(51) Int. Cl.
*F16K 11/14* (2006.01)
(52) U.S. Cl. ............. 137/637.3; 137/614.11; 137/637.1
(58) Field of Classification Search .................. 137/637, 137/637.1, 637.2, 637.3, 614.11
See application file for complete search history.

(56) References Cited

U.S. PATENT DOCUMENTS

| 4,738,276 A * | 4/1988 | Adams ........................... 137/343 |
| 4,823,843 A * | 4/1989 | Golembiski ............... 137/637.1 |
| 4,977,917 A * | 12/1990 | Adams ........................... 137/597 |
| 5,117,867 A * | 6/1992 | Adams ........................... 137/577 |
| 5,274,996 A | 1/1994 | Goff et al. |
| 6,955,040 B1 | 10/2005 | Myers, Jr. et al. |

OTHER PUBLICATIONS

British Search Report issued in British Application No. GB1011554.1 dated Oct. 8, 2010.

* cited by examiner

*Primary Examiner* — Craig Schneider
*Assistant Examiner* — Angelisa Hicks
(74) *Attorney, Agent, or Firm* — Oliff & Berridge PLC

(57) ABSTRACT

A split flow valve arrangement comprising a first valve portion having an inlet, a first outlet and a second outlet; and a second valve portion having a first inlet coupled to the first outlet, a second inlet coupled to the second outlet, a main outlet and a secondary outlet. The inlet is selectively coupled to none, one or both of the first and second outlets; the first inlet is selectively coupled to the main outlet and the second inlet is selectively coupled to the secondary outlet. The first and second valve portions are constrained to move in synchronicity to therefore selectively direct fluid to flow from the inlet to none, one or both of the main and secondary outlets.

12 Claims, 3 Drawing Sheets

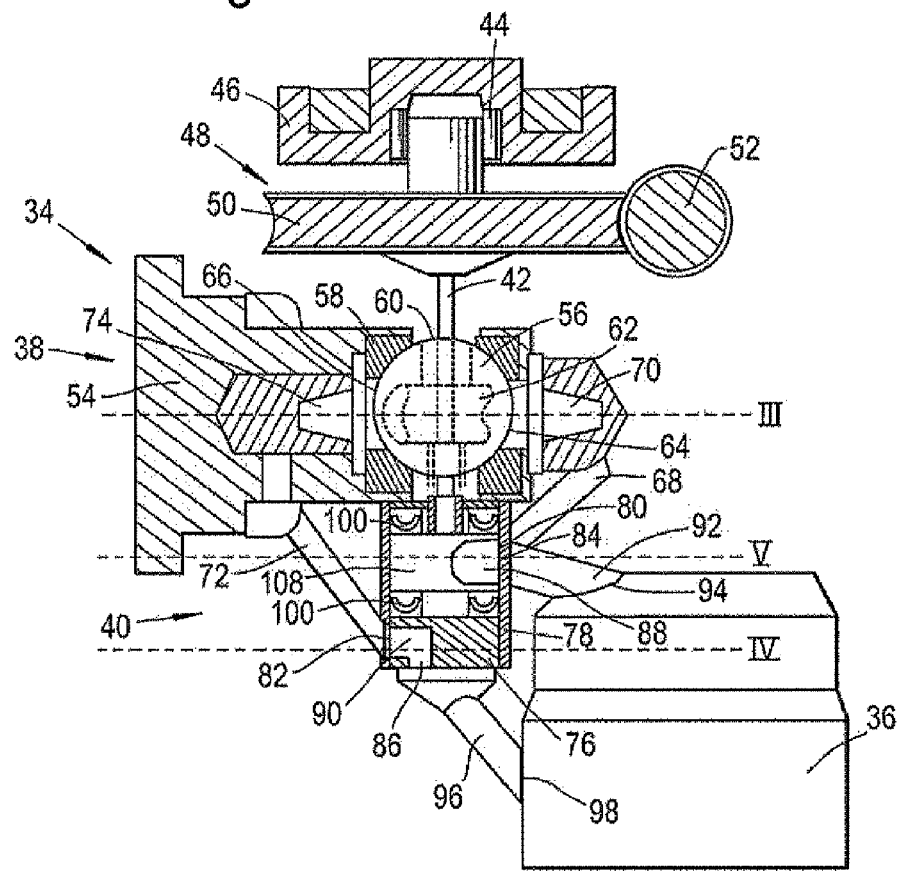
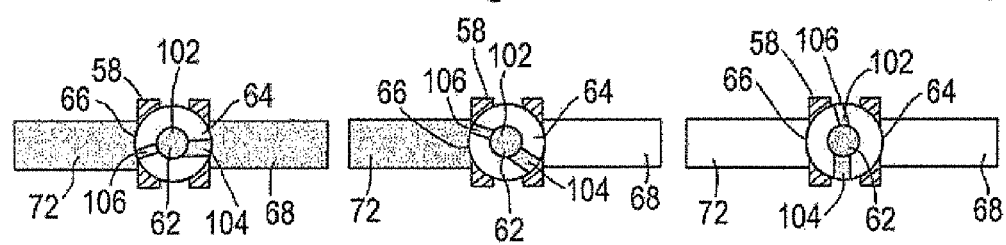

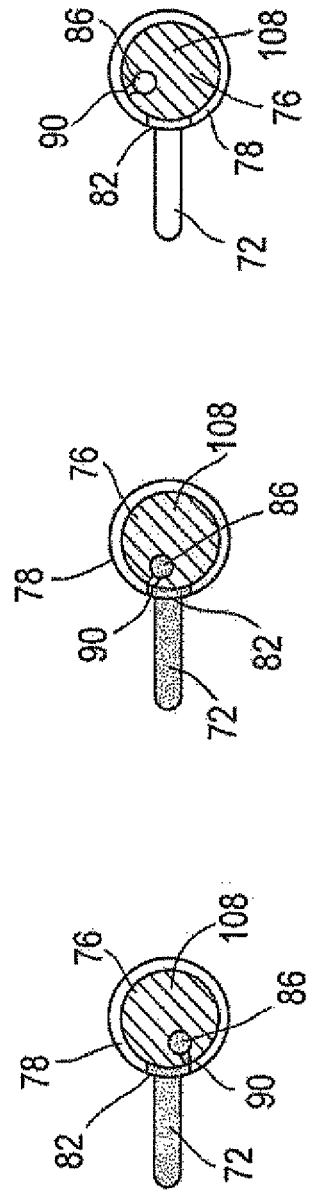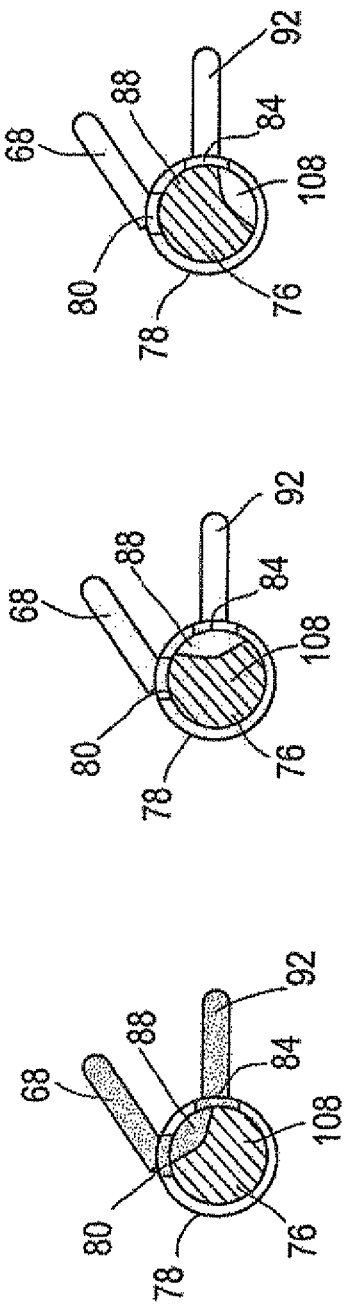

SPLIT FLOW VALVE ARRANGEMENT

The present invention relates to a split flow valve arrangement and finds particular utility for delivering fuel to an injector, for example in a gas turbine engine operating lean burn combustion.

U.S. Pat. No. 6,955,040 discloses a prior art split flow valve arrangement for a gas turbine engine operating lean burn combustion. The arrangement comprises a pair of linear hydraulic valves, one of which feeds fuel to the main injector nozzle and the other feeds fuel to the pilot injector nozzle. A signal fluid is provided to the first hydraulic valve to set the position of the piston to open or restrict main and pilot outlet ports. Fuel is supplied from a fuel manifold into main and pilot inlet ports in the first hydraulic valve. The pilot outlet port is connected to an inlet port on the second hydraulic valve. The second hydraulic valve also has an outlet port and is additionally supplied from the fuel manifold. Dependent on the signal fluid pressure, the pistons in the first and second hydraulic valves are moved to allow no flow, main fuel flow plus pilot fuel flow, main fuel flow plus restricted pilot fuel flow (only supplied from the fuel manifold not from the first to the second hydraulic valve), or pilot flow only. Typically the signal fluid is also fuel.

One disadvantage of this arrangement is that there are several pipes that are filled with fuel that, when ports are closed, is stagnant. In addition there are chambers, such as the piston chambers of the hydraulic valves, that are also filled with stagnant fuel. The stagnant fuel heats up because it is in close proximity to the engine and therefore is prone to coking and otherwise degrading. It is well understood that the pipes in an injector nozzle have small diameter and therefore are likely to become blocked and partially or fully ineffective due to pieces of coke and other debris caused by fuel degradation.

A further disadvantage of this arrangement is that the valves are not tightly sealed so that fuel may leak through the ports which may result in fuel carbonation, particularly on engine shut down. This may restrict or even prevent the correct action of the hydraulic valves in subsequent engine operations, thereby compromising the injector performance.

The mass and spring arrangement of the piston tends to be excited by operational vibration of the engine. Disadvantageously this results in inaccurate positioning of the pistons relative to the ports and in excessive wear between the components which shortens their life.

The present invention provides a split flow valve arrangement that seeks to address the aforementioned problems.

Accordingly the present invention provides a split flow valve arrangement comprising a first valve portion having an inlet, a first outlet and a second outlet; the inlet selectively coupled to none, one or both of the first and second outlets; and a second valve portion having a first inlet coupled to the first outlet, a second inlet coupled to the second outlet, a main outlet and a secondary outlet; the first inlet is selectively coupled to the main outlet and the second inlet is selectively coupled to the secondary outlet; wherein the first and second valve portions are constrained to move in synchronicity to selectively direct fluid to flow from the inlet to none, one or both of the main and secondary outlets.

This arrangement advantageously is more accurate and has better sealing than prior art valve arrangements.

The first and second valve portions may rotate. The first valve portion may comprise a ball valve. Advantageously this portion provides good sealing. The second valve portion may comprise a spool valve or a platen valve. Advantageously this portion provides improved accuracy.

The first and second valve portions may be driven by a common drive shaft. The common drive shaft may be controlled by a worm and wheel arrangement. This may provide a high torque output to give accurate rotational control.

The first and second outlets may be filtered to prevent debris from compromising latter parts of the valve arrangement and the performance of downstream injection nozzles.

The present invention also provides a fuel injector comprising a split flow valve arrangement; a gas turbine engine comprising a split flow valve arrangement as described; and a gas turbine engine comprising a fuel injector as described. The split flow valve arrangement may include any of the optional features disclosed above.

The present invention will be more fully described by way of example with reference to the accompanying drawings, in which:

FIG. 2 is a sectional view of a split flow valve arrangement according to the present invention.

FIG. 3 is a set of sections through the ball valve illustrating different flow regimes.

FIG. 4 is a set of sections through the spool valve at a first location illustrating different flow regimes.

FIG. 5 is a set of sections through the spool valve at a second location illustrating different flow regimes.

Figure 1:
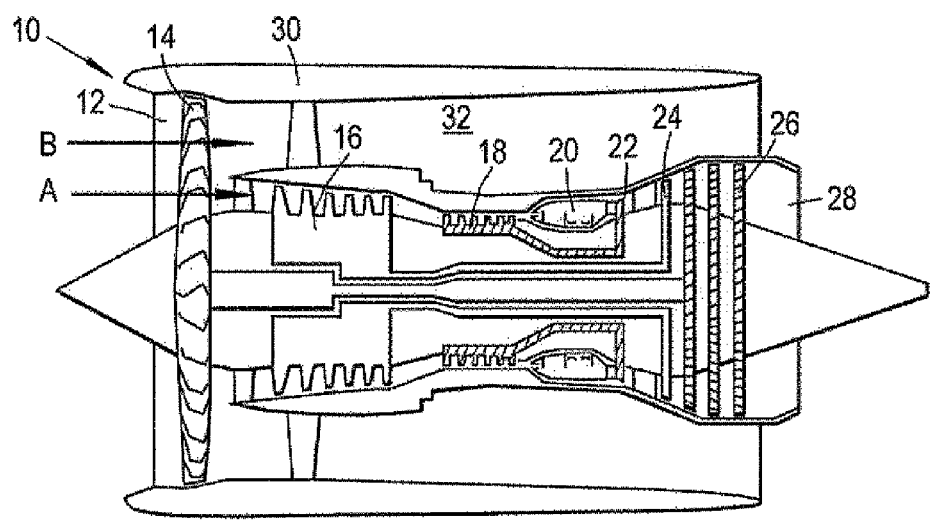
FIG. 1 is a sectional side view of a gas turbine engine.

A gas turbine engine 10 is shown in FIG. 1 and comprises an air intake 12 and a propulsive fan 14 that generates two airflows A and B. The gas turbine engine 10 comprises, in axial flow A, an intermediate pressure compressor 16, a high pressure compressor 18, a combustor 20, a high pressure turbine 22, an intermediate pressure turbine 24, a low pressure turbine 26 and an exhaust nozzle 28. A nacelle 30 surrounds the gas turbine engine 10 and defines, in axial flow B, a bypass duct 32. The combustor 20 comprises a combustion chamber and a plurality of injectors or burners receiving a main and a pilot fuel flow to supply a main and a pilot injector nozzle.

An exemplary embodiment of the split flow valve arrangement 34 of the present invention is shown in FIG. 2. The arrangement 34 is coupled to a head of a burner unit 36 as will be described in more detail below. The arrangement 34 comprises a first valve portion 38 and a second valve portion 40. The first and second valve portions 38, 40 are coupled together and constrained to move in synchronicity with a common drive shaft 42 that is mounted to rotate via bearings 44 in static structure 46. A worm and wheel arrangement 48 is provided on the common drive shaft 42 comprising a wheel 50 mounted on or integral with the common drive shaft 42. The wheel 50 has teeth that intermesh with the external thread of a worm 52 such that when the worm 52 is driven linearly in one direction it causes the wheel 50, and hence the common drive shaft 42, to rotate in a first direction, and when the worm 52 is driven linearly in the other direction the wheel 50 and common drive shaft 42 rotate in the other direction.

The first valve portion 38 is located in housing 54 and comprises a ball valve 56 mounted to the common drive shaft 42. The ball valve 56 is seated in dynamic face seals 58 that effectively seal against fluid leakage whilst accommodating irregularities in the shape of the ball valve 56 caused by manufacturing tolerances or trapped debris. The ball valve 56 comprises an inlet 60 that receives fuel from a fuel source (not shown). The inlet 60 is an aperture in the surface of the ball valve 56, the upper face as illustrated, that is coupled to a small internal cavity 62. It is beneficial that the cavity 62 is small because this reduces the volume of stagnant fuel and the consequent potential for coking.

The first valve portion 38 comprises a first outlet 64 and a second outlet 66 that are apertures in the housing 54. The first and second outlets 64, 66 may be substantially the same and are located diametrically opposite to each other. As illustrated, the first and second outlets 64, 66 are positioned on the left and right hand sides of the ball valve 56 and are selectively coupled to the internal cavity 62 as will be described with respect to FIGS. 3 to 5.

The first outlet 64 is coupled to passages 68. The passages 68 may comprise a filter 70 to trap debris flowing into the passages 68 from the ball valve 56. The second outlet 66 is similarly coupled to passages 72 which may comprise a filter 74 to trap debris flowing into the passages 72 from the ball valve 56.

The second valve portion 40 comprises a spool valve 76 in a cylindrical sleeve 78. The spool valve 76 is coupled to the common drive shaft 42 to rotate in synchronicity therewith. The second valve portion 40 comprises a first inlet 80 that is an aperture in the cylindrical sleeve 78. The first inlet 80 is coupled by the passages 68 to the first outlet 64 of the first valve portion 38. The second valve portion 40 further comprises a second inlet 82 that is also an aperture in the cylindrical sleeve 78. The second inlet 82 is coupled by the passages 72 to the second outlet 66 of the first valve portion 38. The first and second inlets 80, 82 may be located diametrically opposite to each other to allow easy coupling to the passages 68, 72 and are displaced axially from one another.

The second valve portion 40 comprises a main outlet 84 and a secondary outlet 86. The spool valve 76 comprises a first recess 88 that can be positioned, as will be described with respect to FIGS. 3 to 5, to selectively couple the first inlet 80 to the main outlet 84. Similarly, the spool valve 76 comprises a second recess 90 that can be positioned to selectively couple the second inlet 82 to the secondary outlet 86. In the illustrated embodiment, the main outlet 84 is axially aligned but circumferentially displaced from the first inlet 80 whereas the secondary outlet is circumferentially aligned but axially displaced, by being an aperture in the flat end not the curved cylindrical surface of the cylindrical sleeve 78. It will be apparent to the skilled reader that other configurations are possible within the scope of the claimed invention.

The main outlet 84 is coupled via further flow passages 92 to supply a main injector nozzle 94 in the head of the burner unit 36. Similarly, the secondary outlet 86 is coupled via further flow passages 96 to supply a pilot injector nozzle 98 in the head of the burner unit 36. The spool valve 76 may comprise seals 100 to seal the main outlet 84 from the secondary outlet 86.

FIG. 3 is a section through the ball valve 56 as indicated at III in FIG. 2 at three flow conditions. The cross hatching indicates sections of the first valve portion 38 that contain fuel at the illustrated flow condition. The inlet 60 is unrestricted and therefore the cavity 62 always contains fuel. The ball valve 56 includes a valve member 102 that defines the internal cavity 62 and has a first arm 104 and a second arm 106. The arms are hollow and extend from the cavity 62 towards the outer surface of the ball valve 56. Movement of the valve member 102 selectively couples the cavity 62 to none, one or both of the first and second outlets 64, 66 via the first and second arms 104, 106. The first and second arms 104, 106 are always coupled to the cavity 62 and thus are always filled with fuel.

The first and second arms 104, 106 each extend away from the cavity 62 and form an obtuse angle between them. The diameter of the first arm 104 may be larger than the diameter of the second arm 106 to regulate the relative flow through each arm 104, 106.

In the first illustrated flow condition, leftmost drawing, the valve member 102 is rotated such that the first arm 104 is coupled to the first outlet 64. This permits fuel to flow from the fuel source into the inlet 60, through the cavity 62 and the first arm 104 and into the passages 68 towards the second valve portion 40. The angular position of the valve member 102 is also such that the second arm 106 is coupled to the second outlet 66. This permits fuel to flow from the fuel source into the inlet 60, through the cavity 62 and the second arm 106 and into the passages 72 towards the second valve portion 40.

In the second illustrated flow condition, middle drawing, the valve member 102 is rotated such that the first arm 104 is still coupled to the first outlet 64, permitting fuel to flow as in the first flow condition. However, the angular position of the valve member 102 is such that the second arm 106 is not coupled to the second outlet 66 so that no fuel is permitted to flow to the second outlet 66 or into the passages 72.

In the third illustrated flow condition, rightmost drawing, the valve member 102 is rotated further such that neither the first arm 104 nor the second arm 106 are coupled to the first and second outlets 64, 66 respectively. Thus no fuel is permitted to flow into the passages 68, 72.

FIG. 4 is a section through the spool valve 76 at the axial position of the second inlet 82, second recess 90 and secondary outlet 86, as indicated at IV in FIG. 2. The spool valve 76 comprises a valve member 108 that includes the second recess 90 and an internal passage that selectively couples the second recess 90 to the secondary outlet 86. The valve member 108 rotates within the cylindrical sleeve 78, which includes the second inlet 82.

In the first flow condition the valve member 108 is rotated such that the second inlet 82 is coupled to the secondary outlet 86 via the second recess 90. As in FIG. 3 the cross hatching indicates areas in which fuel is present for each flow condition so in this first flow condition fuel is permitted to flow through the further passages 96 to the pilot injector nozzle 98.

In the second flow condition the valve member 108 is rotated clockwise from the first flow condition but such that the second inlet 82 is still coupled to the secondary outlet 86 via the second recess 90. Finally, in the third flow condition the valve member 108 is rotated further clockwise until the body of the valve member 108 blocks the second inlet 82 and the cylindrical sleeve 78 blocks fuel from flowing into the second recess 90 and from there out of the secondary outlet 86.

Since the valve member 108 of the spool valve 76 is constrained to rotate in synchronicity with the valve member 102 of the ball valve 56 via the common drive shaft 42, there is no fuel flowing through the passages 72 in the third flow condition. The dynamic face seals 58 of the first valve portion 38 prevent any fuel from flowing through the second outlet 66 into the passages 72. The position of the valve member 108 of the spool valve 76 provides additional, back up, sealing in case of failure of the face seals 58.

FIG. 5 is a section through the spool valve 76 at the axial height of the first inlet 80, first recess 88 and main outlet 84 as indicated in FIG. 2 by V. As in FIGS. 3 and 4, cross hatching indicates regions in which fuel is present for each of the three flow conditions.

In the first flow condition the valve member 108 is arranged such that the first recess 88 is coupled to both the first inlet 80 and the main outlet 84. Thus fuel is permitted to flow from the passages 68, through the first inlet 80 into the first recess 88 and then out through the main outlet 84 through the further passages 92 to the main injector nozzle 94. The circumferential angle between the passages 68 leading to the first inlet 80 and the further passages 92 leading from the main outlet 84 is preferably less than 90° so that the first recess 88 can have a small volume to reduce the amount of stagnant fuel.

In the second flow condition the valve member 108 is rotated clockwise from the first flow condition until the body of the valve member 108 blocks the first inlet 80. Thus no fuel is permitted to flow into the first recess 88 and so no fuel flows through the main outlet 84 into the further passages 92.

In the third flow condition the valve member 108 is rotated further clockwise so that, as in the second flow condition, the body of the valve member 108 blocks the first inlet 80 so that no fuel can flow into the first recess 88, through the main outlet 84 and into the further passages 92.

Since the valve member 108 of the second valve portion 40 is rotationally coupled to the valve member 102 of the first valve portion 38, no fuel flows into the passages 72 from the ball valve 56 in the second or third flow conditions. The body of the valve member 108 blocking the first inlet 80 therefore provides additional sealing as a back up in case of failure of the dynamic face seals 58.

The net result of the flow conditions as described with respect to FIGS. 3 to 5 is as follows. In the first flow condition fuel flowing into the inlet 60 is split to the first and second outlets 64, 66 in the first valve portion 38, passed to the second valve portion 40 and passed on to the main and pilot injector nozzles 94, 98. Thus there is main and pilot fuel flow. In the second flow condition fuel flowing into the inlet 60 is passed through the second outlet 66 only, through the passages 72 to the second valve portion 40, and on to the pilot injector nozzle 98. Thus there is pilot fuel flow only. In the third flow condition fuel is not passed on from the inlet 60. Thus there is neither main nor pilot fuel flow.

The worm and wheel arrangement 48 allows the valve members 102, 108 to be driven clockwise or anticlockwise between adjacent flow conditions. Thus the split flow valve arrangement 34 can be set to the third flow condition, with no flow to either the main or the pilot injector nozzles 94, 98, and then the valve members 102, 108 rotated to the second flow condition to allow pilot fuel flow. From there the split flow valve arrangement 34 can be further rotated to the first flow condition to allow main and pilot flow, or can be rotated back to the third flow condition to prevent more flow. The worm 52 of the worm and wheel arrangement 48 may have sufficient travel to allow the valve members 102, 108 to rotate between the first and third flow conditions also without passing through the second flow condition.

The ball valve 56 and dynamic face seals 58 provide excellent sealing against leakage. The spool valve 76 comprises accurately machined inlet and outlet ports so it provides accuracy. Therefore the split flow valve arrangement 34 of the present invention provides a valve having simultaneously good sealing and accuracy. The valve members 102, 108 may be designed so that the opening and shutting of the inlets and outlets is phased. This beneficially reduces wear on the ball valve 56 by reducing the instantaneous change of pressure caused by coupling the main and secondary outlets 84, 86 to the inlet 60. This coupling could expose the ball valve 56 to the potentially lower pressure in the combustor 20 and the burner unit 36. However, by provision of the passages 68, 72 between the first and second valve portions 38, 40, the speed of the pressure change is reduced.

Although a worm and wheel arrangement 48 has been described to drive the common drive shaft 42 and thence the valve arrangement 34, other drive mechanisms may be substituted with equal felicity. Although the second valve portion 40 has been described as a spool valve 76, a rotary platen valve or other rotary valve may be used instead.

As will be apparent to the skilled reader, the ball valve 56 may comprise different inlet 60 and outlets 64, 66 configurations. The angular spacing between the first and second outlets 64, 66 may also be varied within the scope of the present invention.

The invention claimed is:

1. A split flow valve arrangement comprising
a first valve portion having an inlet, a first outlet and a second outlet; the inlet selectively coupled to none, one or both of the first and second outlets; and
a second valve portion having a first inlet coupled to the first outlet, a second inlet coupled to the second outlet, a main outlet and a secondary outlet; the first inlet is selectively coupled to the main outlet and the second inlet is selectively coupled to the secondary outlet;
wherein the first and second valve portions are constrained to move in synchronicity to selectively direct fluid to flow from the inlet to none, one or both of the main and secondary outlets.

2. A split flow valve arrangement as claimed in claim 1 wherein the first and second valve portions rotate.

3. A split flow valve arrangement as claimed in claim 2 wherein the first valve portion comprises a ball valve.

4. A split flow valve arrangement as claimed in claim 2 wherein the second valve portion comprises a spool valve.

5. A split flow valve arrangement as claimed in claim 2 wherein the second valve portion comprises a platen valve.

6. A split flow valve arrangement as claimed in claim 2 wherein the first and second valve portions are driven by a common drive shaft.

7. A split flow valve arrangement as claimed in claim 6 wherein the common drive shaft is controlled by a worm and wheel arrangement.

8. A split flow valve arrangement as claimed in claim 1 wherein the first and second outlets are filtered.

9. A split flow valve arrangement as claimed in claim 1 wherein the first valve portion is sealed by dynamic face seals.

10. A fuel injector comprising a split flow valve arrangement as claimed in claim 1.

11. A gas turbine engine comprising a fuel injector as claimed in claim 10.

12. A gas turbine engine comprising a split flow valve arrangement as claimed in claim 1.

* * * * *